United States Patent [19]

Scifres et al.

[11] 4,349,906
[45] Sep. 14, 1982

[54] OPTICALLY CONTROLLED INTEGRATED CURRENT DIODE LASERS

[75] Inventors: Donald R. Scifres, Los Altos; William Streifer, Palo Alto; Robert D. Burnham, Los Altos Hills, all of Calif.

[73] Assignee: Xerox Corporation, Stamford, Conn.

[21] Appl. No.: 76,633

[22] Filed: Sep. 18, 1979

[51] Int. Cl.³ .............................................. H01S 3/19
[52] U.S. Cl. ...................................... 372/50; 357/17; 357/30; 357/40; 357/41
[58] Field of Search .................... 331/94.5 H; 357/40, 357/41, 17–19, 30; 307/312; 350/96.11; 330/4.3; 332/7.51

[56] References Cited

U.S. PATENT DOCUMENTS

| | | | |
|---|---|---|---|
| 3,430,050 | 2/1969 | Grimmeiss | 250/211 J |
| 3,518,574 | 6/1970 | Rutz | 331/94.5 H |
| 3,555,283 | 1/1971 | Grimmeiss | 250/217 |
| 3,649,838 | 3/1972 | Phelan, Jr. | 250/211 J |
| 3,728,593 | 4/1973 | Coleman | 357/17 |
| 3,768,037 | 10/1973 | Migitaka et al. | 331/94.5 H |
| 3,881,113 | 4/1975 | Rideout et al. | 250/5.51 |
| 3,882,532 | 5/1975 | Quinn | 357/29 |
| 3,946,423 | 3/1976 | Augustine | 357/30 |
| 4,065,729 | 12/1977 | Gover et al. | 331/94.5 H |
| 4,080,617 | 3/1978 | Dyment | 357/17 |
| 4,136,928 | 1/1979 | Logan et al. | 350/96.11 |
| 4,212,020 | 7/1980 | Yariv | 331/94.5 H X |

OTHER PUBLICATIONS

I. Ury et al., "Monolithic Integration of an Injection Laser and a Metal Semiconductor Field Effect Transistor", Appl. Phys. Lett. 34(7), 1 Apr. 1979, pp. 430–431.

*Primary Examiner*—James W. Davie
*Attorney, Agent, or Firm*—Franklin C. Weiss

[57] ABSTRACT

Integrated laser diode devices are disclosed in which small light signals or small current signals applied thereto produce large changes in the output. One embodiment discloses a homostructure optical device with symmetric optically excited regions. Another embodiment discloses a single-heterostructure optical device with a single optically excited region. Another embodiment discloses a double-heterostructure optical device with dual optically excited regions. A further embodiment integrates an electronic device with a diode laser in accordance with the principles of the present invention. Still another embodiment discloses an optical triode laser device in which a small input light results in an amplified light output signal.

21 Claims, 13 Drawing Figures

OPTICALLY CONTROLLED INTEGRATED CURRENT DIODE LASERS

The invention relates to optically controlled integrated current lasers; integrated laser diode devices are disclosed in which a small light signal or small current signal produces large changes in the output of a laser diode; and, in a further embodiment, an electronic device is integrated on the same diode laser structure.

BACKGROUND OF THE INVENTION

Semiconductor diode lasers were developed in 1962 almost simultaneously by several groups of workers. Since then much development work has evolved in the development and use of light emitting semiconductor diodes.

There are at least three groups of diode lasers and are classified according to structure. Simple diode lasers are called homostructure lasers because they are made of a single semiconductor material. A homostructure diode laser would comprise, for example, n-type and p-type gallium arsenide (GaAs). The recombination of electrons injected from the n-region into the p-region with holes extending in the p-region causes the emission of laser light.

In a single-heterostructure semiconductor laser device an additional layer of aluminum gallium arsenide (AlGaAs), for example, is added. This type of crystal has had some of the gallium atoms in the gallium arsenide crystal replaced by aluminum atoms. The injected electrons are stopped at the aluminum gallium arsenide layer (junction) resulting in a higher degree of concentration of light emitted.

In a double-heterostructure semiconductor laser device, for example, three layers of gallium arsenide are separated by two layers of aluminum gallium arsenide. The barrier set up by the preselection of n-type or p-type materials causes even further confinement of the light emitted.

According to the present invention, several embodiments or semiconductor laser devices, are disclosed. One embodiment discloses a homostructure optical device with symmetric optically excited regions. There are two controlled regions, one on either side of the light emitting junction.

Another embodiment of the present invention discloses a single-heterostructure optical device with a single optically excited region. With the biases set forth as described, a small input light signal or small current change produces large changes in the output of the diode.

Another embodiment of the present invention discloses a double-heterostructure optical device with dual optically excited regions. In this embodiment there are two areas on the device which may trigger the laser output light in response to either one or the other of optical light input.

A further embodiment of the invention disclosed herein integrates an electronic device with a diode laser in accordance with the principles of the present invention. Small optical or electronic signals produce large changes in laser current and thus a large change in output light.

Still even a further embodiment of the present invention discloses an optical triode laser device in which a small input light results in an amplified light output signal. On a single semiconductor laser diode crystal, a field effect transistor together with an optically controlled gate is used to modulate the current to a short section of a semiconductor laser.

DESCRIPTION OF THE DRAWINGS

For a more complete understanding of the invention, reference may be had to the following detailed description of the invention in conjunction with the drawings wherein.

DETAILED DESCRIPTION OF THE INVENTION

Figure 1:
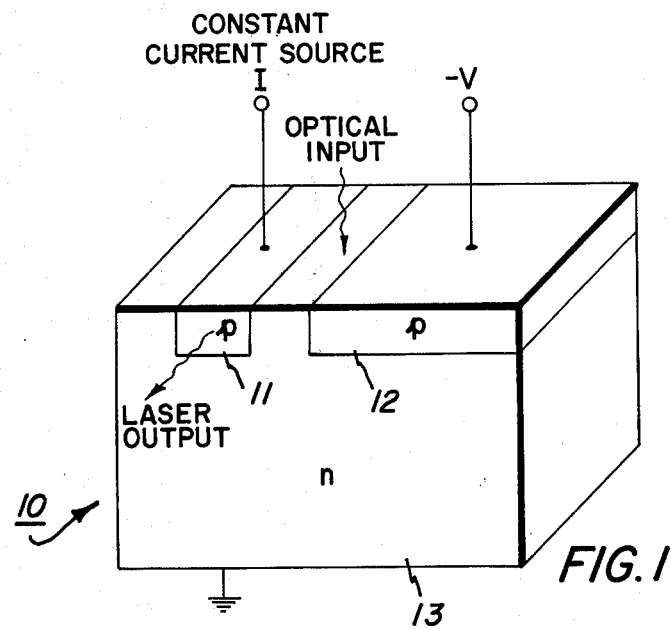
FIGS. 1 and 2 disclose homostructure optical devices.

The first embodiment of the present invention is a device 10 in which a small light signal or small current signal produces large changes in the output of a laser diode. A first possible configuration in the form of a homostructure optical modulation device is shown in FIG. 1. The device, as shown, has three separate regions: regions 11 and 12 are p-type, and region 13 is n-type. When a forward bias (constant current source I) is applied to the p-n junction between regions 11 and 13, a current flows to ground (or other appropriate voltage level) and laser operation occurs at sufficiently high current levels with light emitted from region 11. If a negative bias $-V$ is applied to region 12, an alternative path for current flow through regions 11-13-12 is formed. If current in the narrow portion of region 13 is modulated by absorption of a small optical input signal in that region (or by an externally modulated voltage), then current flow through regions 11-13-12 is also modulated in an amplified manner. This current increase is at the expense of current flow through the lasing junction 11-13 and thus the laser output will decrease. Also, if electrical modulation of current in region 13 is utilized, a small variation in current to the area between regions 11 and 12 will cause a large change in laser light output.

The semiconductor laser diode device 10 as shown in FIG. 1 is fabricated by masking the surface of an n-type substrate of a semiconductor light emitting material such as GaAs with a mask suitable to stop the diffusion or implantation of a p-type species. For diffusion in GaAs, a $Si_3N_4$ layer is deposited on the substrate and holes are fabricated in the nitride by standard photolithographic and plasma etching procedures. A p-type dopant, that is, zinc, is diffused through the openings to define regions 11 and 12. The opening between regions 11 and 12 should be kept narrow, that is, less than a diffusion length, approximately 0.2 to 10 micrometers, so that high current gain can be achieved. After diffusion, the nitride may be removed, if desired, and contacts can be applied to regions 11, 12 and 13. The laser device can also be fabricated by implanting p-type species through a suitable ion implantation mask.

Figure 2:
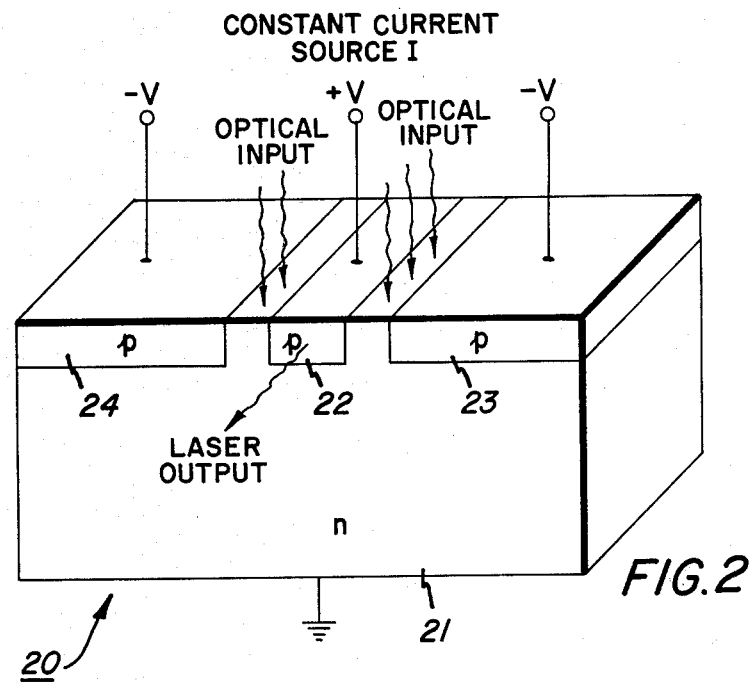

FIG. 2 discloses a homostructure optical device with symmetric optically excited regions. This second structure, which functions in the same manner as that described in FIG. 1, except that there are now two control regions, one on either side of the light emitting p-n junction at layer 22. This allows current to be drained from either side of the center light emitting p-n junction and lessens the problem of resistance from one side of region 22 to the other. Thus, with a constant current source I applied to layer 22, negative voltage biases applied to p-type layers 23 and 24, together with optical inputs applied to region 21, between layers 22 and 23 and layers 22 and 24, light will be emitted from the junction between layers 21 and 22 as set forth above.

Although subsequent figures may not show the dual configuration as set forth in FIG. 2, its use may be implied in all the geometries set forth. The fabrication of the structure in FIG. 2 is identical to that of FIG. 1 with the additional modification in masking necessary to form the second collector region.

Figure 3:
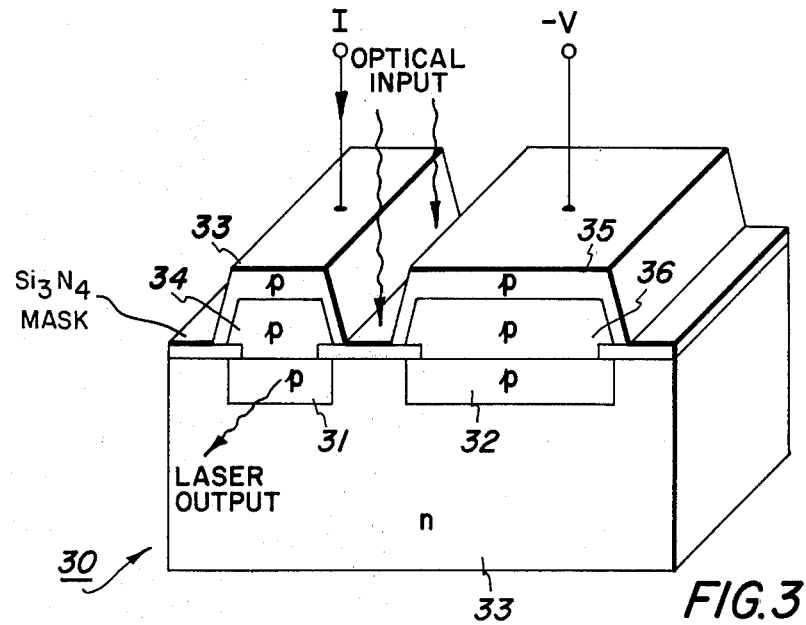
FIG. 3 discloses a single-heterostructure optical device with a single optically excited region.

FIG. 3 shows a single-heterostructure optical device with a single optically excited region of the optical modulator of the present invention. Utilizing an optical modulation device as set forth in FIG. 1, the device shown in FIG. 3 discloses the GaAlAs layer 34 and 36 grown over the unmasked regions 31 and 32. The GaAlAs layers 34 and 36 serve to confine the optical wave and the injected electrons in the region 31 as it does in the case of a single-heterojunction laser. This lowers the laser threshold current and increases device efficiency. The laser device 30 is fabricated by masking a substrate with $Si_3N_4$ and growing zinc doped GaAlAs layers by any of the known techniques. During growth, the zinc diffuses into the substrates to form regions 31 and 32. Device 30 may also be fabricated by first forming regions 31 and 32 and subsequently growing GaAlAs on them to form layers 33, 34, 35, and 36.

Figure 4:
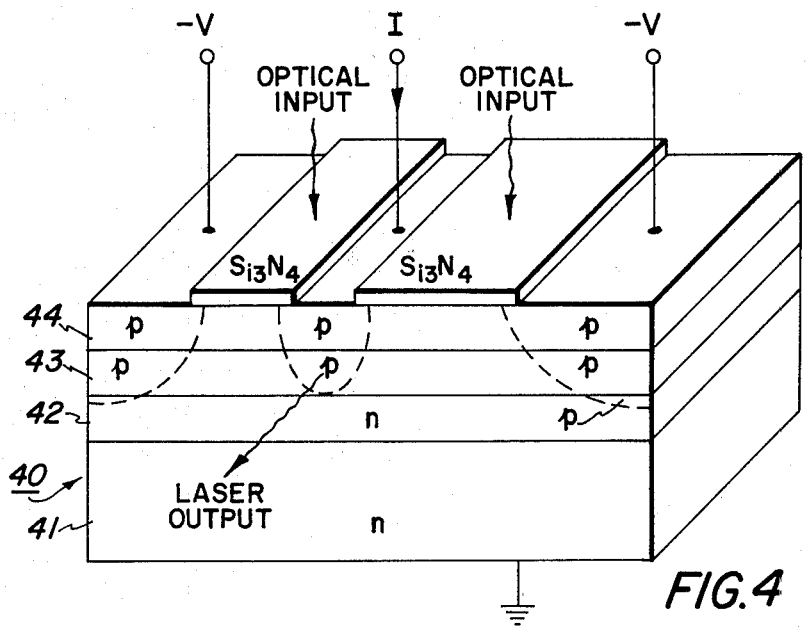
FIG. 4 discloses a double-heterostructure optical device with dual optically excited regions.

FIG. 4 discloses a double-heterostructure optical device with dual optically excited regions similar to that of FIG. 3, however now with two optical inputs. This double-heterojunction configuration allows laser thresholds to be lower than those of single-heterojunction or homojunction devices as set forth above. This device is grown in three layers of n-type GaAlAs (layer 44), n-type GaAs (layer 43) and n-type GaAlAs (layer 42) on an n-type GaAs substrate 41. The p-type regions in layers 42, 43, and 44 can be either diffused or ion implanted as known in the prior art.

Figure 5A:
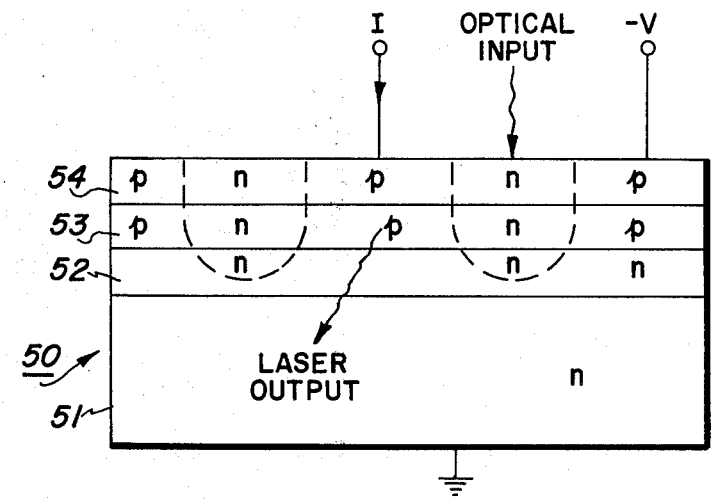
FIGS. 5A and 5B disclose schematic representation of a double-heterostructure optical device formed by diffusion or implantation of an n-type optically excited region.

FIG. 5A shows a double-heterostructure device similar to that shown in FIG. 4 with, however, the inverse doping profile of that in FIG. 4. That is, instead of diffusing or implanting p-type species, n-type species are diffused or implanted. Layer 54 consists of p-type GaAlAs, layer 53 consists of p-type GaAs, and layer 52 shows p-type GaAlAs grown on an n-type GaAs substrate 51. Also, if a p-type GaAs substrate were used, the doping profile could be exactly inverted relative to that of FIG. 5. In this case, the first grown layer 52 would be p-type GaAlAs; the next layer 53 would be n-type GaAs; and the third layer 54 would be n-type GaAlAs. Then a p-type dopant could be diffused or implanted into the region shown as n-type, within the dashed lines of FIG. 5.

Figure 5B:
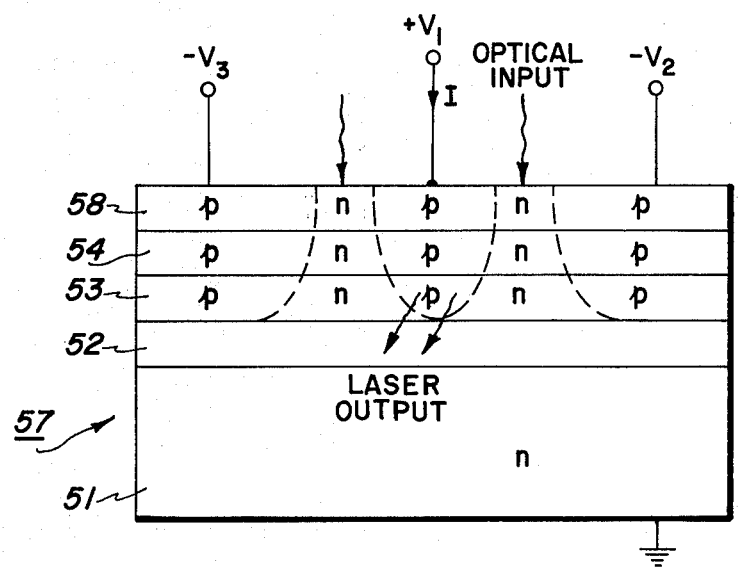

FIG. 5B discloses an alternative configuration of the double-heterostructure devices shown in FIGS. 4 and 5.

In this embodiment, a low band-gap GaAs layer 58 is added to the device. Because the band-gap of this layer 58 is lower than that of the light emitting layer 53, this device can be used to sense its own emission in addition to that of other laser devices with similar emitting layer composition. That is, the optical input is absorbed in layer 58, causing a portion ($I_1$) of the injected current I to flow into the p regions of layer 58 which are biased to voltage $-V$. Because the current ($I_1$) is subtracted from I, the current $I_2$ into the lasing region of layer 53 is decreased ($I_2 = I - I_1$) thus causing the laser intensity to be decreased as was the case in FIGS. 4 and 5.

In FIG. 5B, one or two optical inputs could be used. Also, the conductivity types could be inverted. Further, the contact to layer 51, although shown as being grounded, could be adjusted with respect to voltage. Layer 51 is GaAs, layer 52 is $Ga_{0.7}Al_{0.3}As$, layer 53 is $Ga_{0.9}Al_{0.1}As$, layer 54 is $Ga_{0.7}Al_{0.3}As$, and layer 58 is GaAs.

Figure 6:
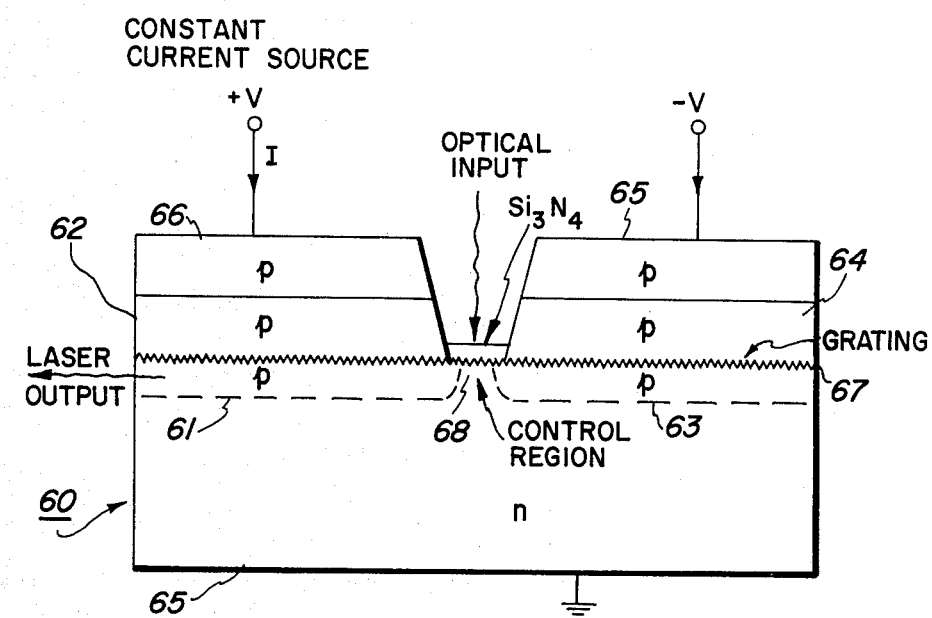
FIG. 6 discloses a schematic representation of a single-heterostructure optically modulated device with distributed feedback grating.

FIG. 6 shows a different configuration of a single-heterostructure optical device optically modulated with a distributed feedback grating. A grating 67 provides optical feedback and is placed at the interface between regions 61 and 62 as well as regions 63 and 64. A forward bias $V_1$ is applied to the junction of layers 61 and 65 to provide light output from layer 61. Feedback is supplied by the grating so that laser emission is in the direction shown and is emitted from region 61. The electrical path 61-65-63 provides an alternative current path when a negative voltage $-V$ is applied to region 64 via region 641. This device can act to deplete the current from the laser section, region 61, when a light source illuminates the control region 68. This may be an external light source or the laser light itself can generate carriers therein by absorption. If the former is the case, the application of an external light source causes a decrease in light laser output whereas if the latter phenomenon is used the laser will tend to limit its own output. In fact, mode locking could occur with self absorption because the lowest loss should occur with high power light pulses.

It should be noted that all of the devices described herein are symmetrical in that the conductivity types can be inverted without affecting device operation. That is, a p-n-p device is shown in the above diagrams while an n-p-n device can be made to operate in the same manner. Also, the light emitter need not be a laser, but could be a light emitting diode. In addition, crystal compositions although shown to be GaAs could be any light emitting semiconductor material; and the laser geometries shown could be any of the known types of stripe geometry lasers.

In addition to the inventive techniques set forth above, significant advantages can be obtained by integrating an electronic device with a diode laser or light emitting diode. Clearly, then, small optical or electronic signals can produce large changes in laser current and thus a large change in light output. Also, integration allows the elimination of the need for time consuming and expensive fabrication of lead interconnections between the devices. Thus, because the entire device is on one semiconductor crystalline array, the leads are internally connected, the current path length is short and the capacitance is low so that the high frequency response is improved.

In the next group of embodiments are described a series of device geometries in which an electronic device and a diode laser are integrated into a single device.

The geometries described below applied to double-heterostructure laser diodes, but homojunction, single heterojunction and buried heterojunction lasers as well as distributed feedback and various type of striped geometries such as CSP, strip buried hetero and diffused stripe (TJS) lasers as well as others, can also be used for the laser section of the device.

Figure 7:
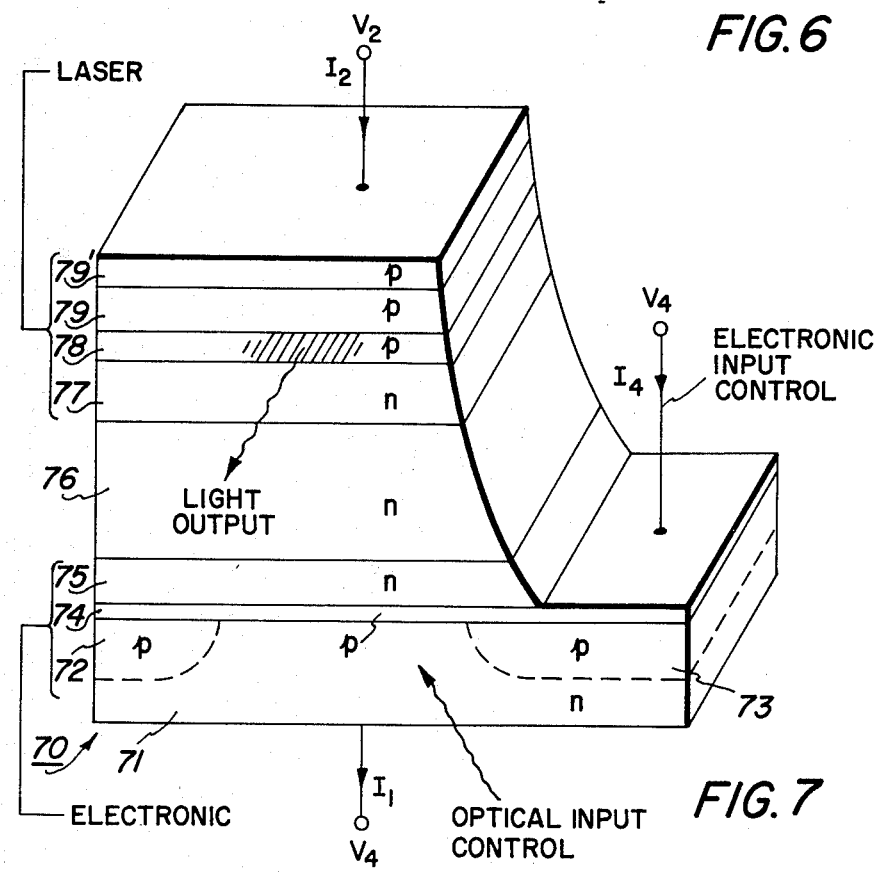
FIGS. 7 to 9 disclose schematic representations of integrated laser diodes with n-p-n controllers.

FIG. 7 discloses a diagram of such an integrated unit 70 consisting of a p-n junction laser diode grown upon n-p-n layers. The electronics sections consists of an n-type region 71 composed of GaAs, GaAlAs or other appropriate semiconducting crystal which is compatible with light emission, such as, GaAsP, GaAlSbAs, InGaAsP, etc. Disclosed are devices composed of GaAs and GaAlAs since these are the most common types of laser diode materials. Region 72 and region 73 are p-type and may be composed of the same material as region 71. They facilitate contact to the p-type region 74 and reduce its resistance. In FIG. 7 only region 74 is shown connected to the voltage, but both sides may, in fact, be so connected.

The p-type region 74 is comprised of GaAs or low aluminum content GaAlAs. The layer 74 is doped with a p-type impurity with a long electron diffusion length, and is so thin that the gain B is maximized. The thickness of region 74 could range from approximately 0.1 micrometers to 10 micrometers, and a suitable impurity is silicon or germanium. The use of silicon is particularly useful since it lowers the effective band-gap of region 74, which maintains current flow only through the center section and not through the forward biased junction between regions 71 and 73. Also, the use of GaAlAs in regions 71 and 73 has the same effect of confining $I_4$. The wider band-gap of junction 71-73 reduces the importance of the resistance in region 73. Region 73 is composed of either n-type GaAs or low aluminum content n-type GaAlAs. Region 76 is an n-type region to provide low resistance contact; it may simply be an extension of region 75. Region 77 begins the laser portion of the device, and for a double-heterostructure GaAs/GaAlAs laser it should be comprised of n-type $Ga_{1-x}Al_xAs$ with x equal to or approximately 0.25. Region 78, which may be either p or n-type, is the active (optical) region of the laser and is comprised of either GaAs or low aluminum contents GaAlAs. Region 79 is comprised of p-type $Ga_{1-x}Al_xAs$ (where x is greater than or approximately equal to 0.25) and serves to confine injected electrons in the optical wave to the active region 78, as in a standard double-heterostructure laser. Region 791 is generally comprised of p-type GaAs and serves to provide good ohmic contact to the bias supply in as much as aluminum containing layers are sometimes difficult to so contact.

The device 70 in FIG. 7 functions as follows. The contact to region 791 is biased positive relative to regions 71 and 73. This bias may be approximately 10 volts. When the bias on region 73 is held positive, approximately 1.4 volts, relative to region 71, current can begin to flow through region 74. This current causes the controller to conduct current, and therefore current flows to the laser diode section. Thus there is current injection into region 78, the laser active region, which results in a laser output of sufficiently high current densities. (It may be desirable to reduce the laterial emitting area of region 78 by using striped geometries to restrict current flow to a narrow channel.) By modulating current $I_4$, laser current is modulated by an amplified amount, and so a small current modulation can cause large changes in laser output. The current $I_4$ may also be modulated by an optical signal which is absorbed therein. An interesting possibility is modulation and/or amplification of one such laser device by another. If, for example, region 4 has a lower band-gap than light emitting section 8 and if region 1 is transparent to the radiation from layer 78, the light sensitive region can absorb the signal from a second identical laser diode device. This absorption will cause the current to flow which results in an amplified current flow through the laser section of device 70. Thus, a small light input signal as shown can be amplified and retransmitted. Such a device 70 could have implications for repeaters and amplifiers in fiber optic transmission lines as well as in logical elements such as optical multivibrators. Also, more than one complete device could be integrated on a single substrate. Distributed feedback might also prove useful in this case.

The device shown in FIG. 7 may be fabricated as follows. First an n-type substrate 71 is selectively diffused or implanted to create p-type regions 72 and 73. Next, layers 74 through 791 are grown by either of the prior art techniques. After growth of layer 74, a region may be selectively masked, so that a portion of layer 74 is exposed in order to make electrical contact, if desired. An alternate approach to obtain this contact is to selectively etch layers 75–791 away in order to expose region 74. Finally, contacts are fixed to regions 71, 791, and region 74. If the unit as shown in FIG. 7 was symmetrical, a similar electric contact would be affixed to layer 74 opposite region 72 instead of opposite 73, as already shown.

Figure 8:
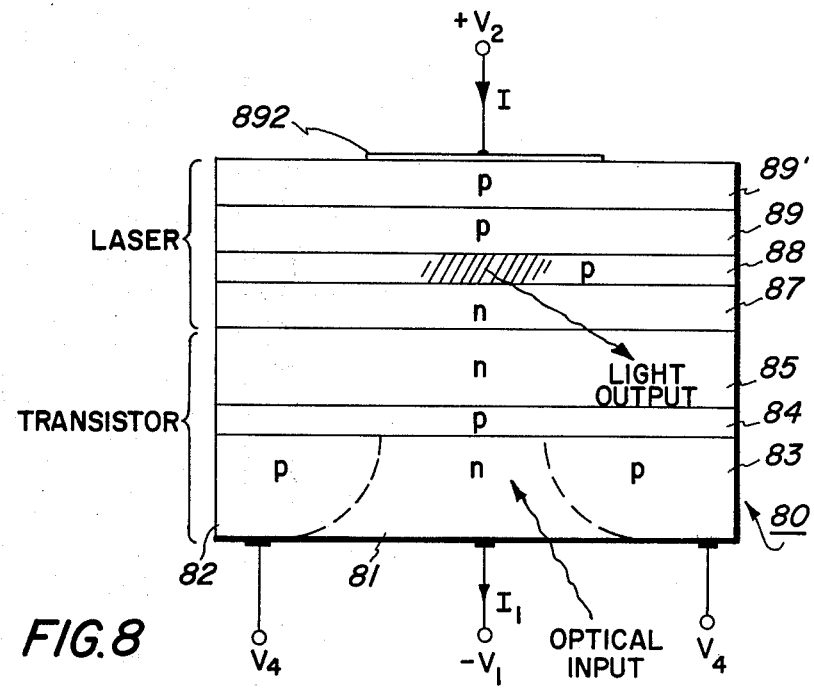

A further embodiment is shown in FIG. 8. As shown therein, the diode laser and controller integrated unit 80 is shown having an n-p-n configuration and a p-n junction laser, but contact to the p-type region is made on the opposite side of the crystal. This has the advantage that the structure remains planar, and region 891 can be directly connected to a heatsink 892. The structure 80 can be fabricated by first selectively diffusing a p-type dopant into an n-type substrate 81, 82, and 83, and then growing planar layers 84 to 891. After growth, the substrate is polished away until the p-type layers are exposed. Alternatively, layers 84 to 891 can be grown on an n-type substrate 81. Then p-type regions 82 and 83 can be formed either by selective diffusion or ion implantation. Another alternative fabrication procedure is to grow the device on a p-type substrate. That is, layer 891 is the p-type substrate, and layers 89, 88, 87, 85, 84, and 81 are grown in that order. Next, the final grown layer is masked so that regions 82 and 83 can be diffused or implanted. Substrate 891 can then be polished down and contacts can be fabricated.

Figure 9:
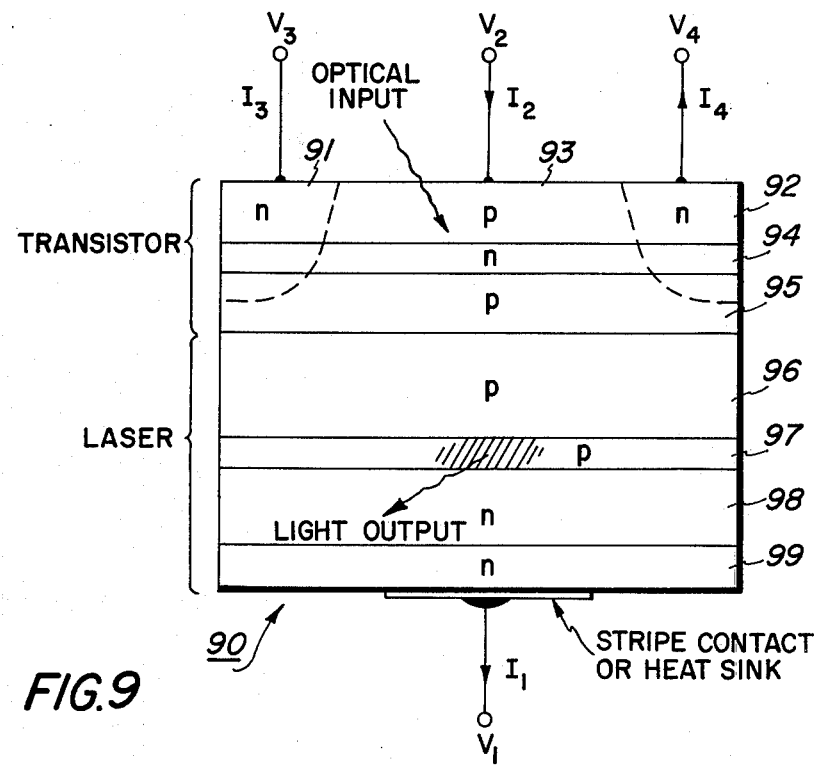

The semiconductor laser device as set forth in FIG. 8 can also be inverted as to conductivity type, as shown in FIG. 9. Here, a p-n-p structure is used to provide current amplification. Methods of fabrication are similar to those described for the n-p-n devices of FIGS. 7 and 8. Contact may be made on either side of the device by selective diffusion, implantation, or etching processes as described above such that optical input on layer 92 will generate a laser output on layer 97.

Figure 10:
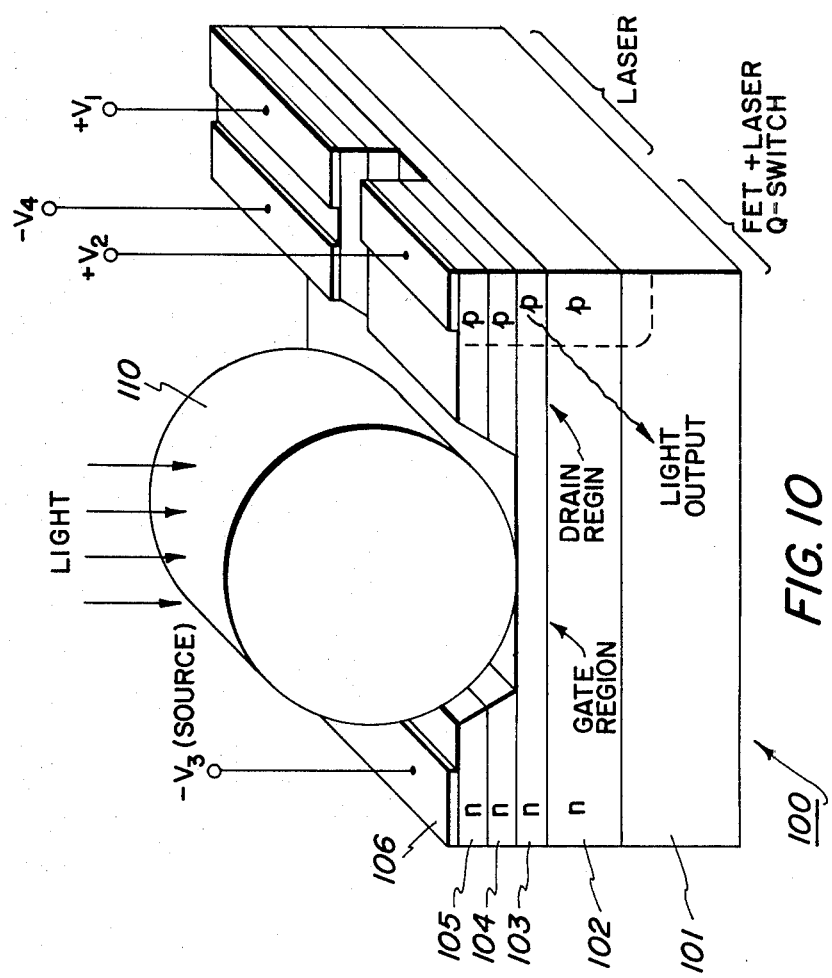
FIGS. 10 to 12 disclose schematic representations of optical triodes in various configurations.

A further embodiment of the present invention is an optical triode in which a small input light results in an amplified output signal. FIG. 10 shows an optical triode 100 of the present invention including a field effect transistor and laser technology on the same substrate crystal. The field effect transistor section of the crystal is fitted with an optically controlled gate so as to be used to modulate the current to a short section of a semiconductor laser. In the embodiment shown there is no gate electrode but optical injection which results in current gain due to the difference in mobility between n and p-type charges. The current into the drain region of the field effect transistor allows the Q-switch section of the laser to be forward biased. This results in the laser turning on with an amplified (Q-switched) light output. If the gain of the field effect transistor is sufficient, the laser need not be Q-switched, but rather could run by allowing the field effect transistor to supply the entire forward bias current. Thus, the laser would consist of a single section. The cylindrical fiber lens 110 is also shown in the figure to allow for focusing the light from an external source onto the gate region.

Device 100 would be comprised of a layer 101 being GaAs. Layer 102 is n-type GaAlAs; layer 103 is n-type GaAs; layer 104 is n-type GaAlAs; while layer 105 is n-type GaAs.

Figure 11:
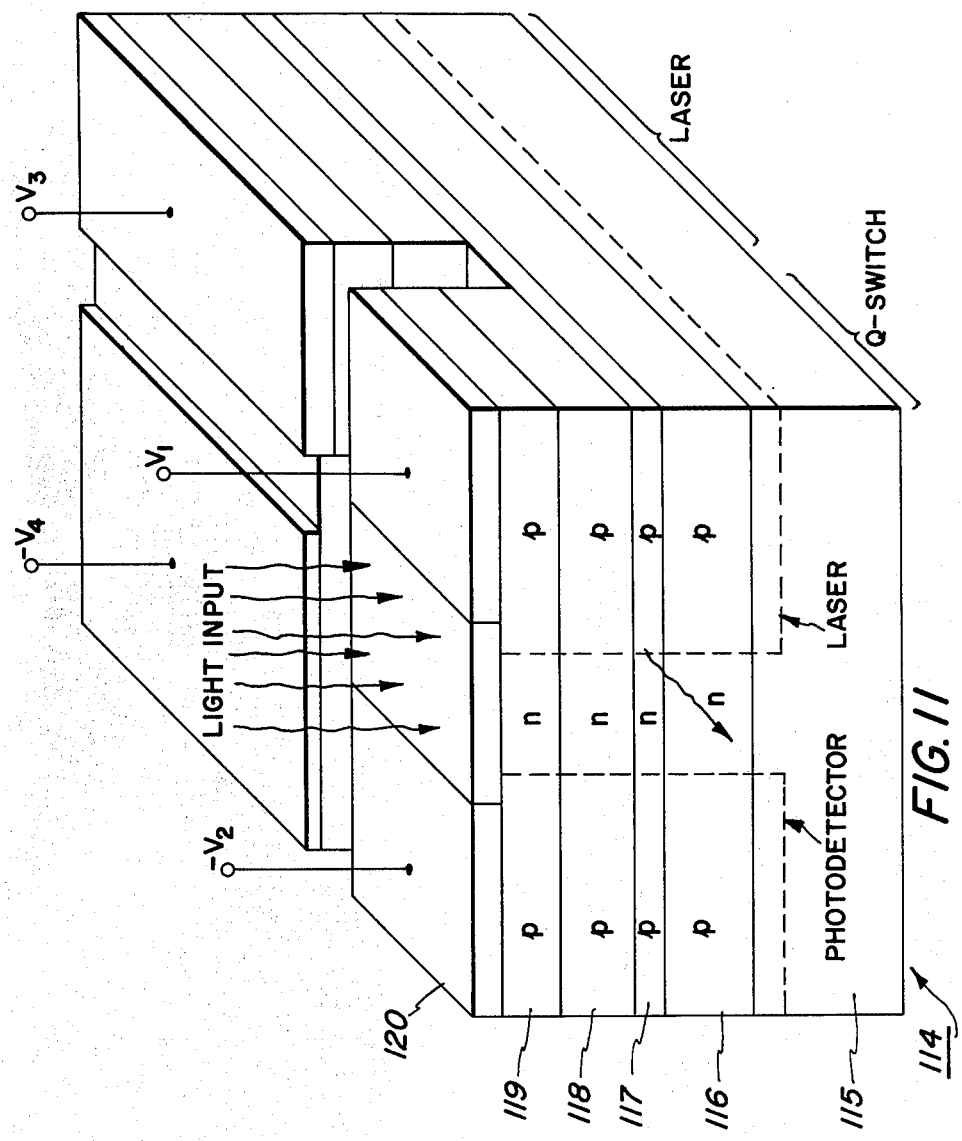

A further embodiment of the invention shown in FIG. 10 is shown in FIG. 11. In this embodiment, a GaAs avalanche photodetector which is reversed biased is placed in series with a forward biased laser junction. When light is absorbed by the avalanche photodetector, a current is supplied to the Q-switched section of the laser to allow the laser to turn on. The small light signal input, therefore, produces a large output light signal from the laser section. The optical triode 114, is comprised of layer 115 of GaAs; while layer 116 is p-type $Ga_{0.6}Al_{0.4}As$; layer 117 p-type GaAs; layer 118 is p-type $Ga_{0.6}Al_{0.4}As$; with layer 119 p-type $Ga_{0.9}Al_{0.1}As$.

Figure 12:
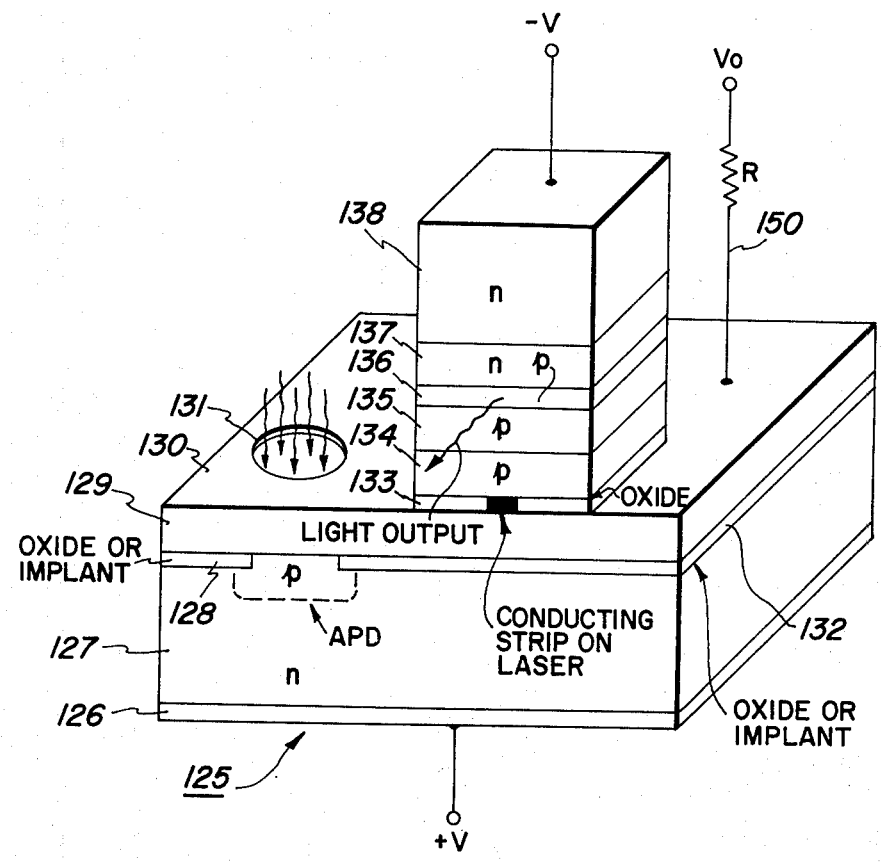

FIG. 12 shows a hybrid design of an optical triode 125 employing a silicon avalanche photodetector and a GaAs laser. This device has the advantage that it is sensitive to radiation from other GaAs sources. In this case the silicon avalanche photodetector is reversed biased such that only a small current flows in the absence of an optical signal. When the optical signal is received at aperture 131, a large current is supplied to forward bias the GaAs laser. Upon sufficient forward current injection, the laser oscillates and an amplified light output signal is obtained. Although not shown, in this case, a Q-switched laser might also be used to increase the gain. Also, for a higher speed avalanche photodetector, a GaAs or InP based device might be utilized.

The triode could be constructed with a base layer 126 as a base to apply the positive voltage V. Layer 127 could comprise n-type silicon with the avalanche photodetector of a p-type material grown as shown. Layer 129 could comprise a metallic material sufficient for strength with an aperture therein 131 to allow the light to impinge upon the p-type material in layer 127. The laser structure would comprise the oxide layer 133 with layer 134 being p-type GaAs; layer 135 being p-type GaAlAs; layer 136 being p-type GaAs; layer 137 being n-type GaAlAs; and layer 138 being n-type GaAs.

It may also be advantageous to bias the laser at or slightly above threshold with a lead 150 and resistor R attached to bias supply $V_o$. In this case, $V_o$ and R can be set so that current flows through the laser even when no light is supplied to the avalanche photodetector (APD). When light is supplied to the APD, more current flows through the laser and the light output signal is modulated. A typical case might be where $V_o = V_2$ and R=megohm. If the APD has a gain of 100 and a collection efficiency of 60% and if the laser has a 50% differential quantum efficiency, an overall gain of 30 (photons out/photons in) could be obtained with this configuration. In addition to utilizing the APD an optically controlled field effect transistor (FET) fabricated in the silicon (Si) could be substituted for the APD and a similar or even greater gain could be obtained. Furthermore, such a device could be made to operate at a lower voltage.

While the invention has been described with reference to specific embodiments, it will be understood by those skilled in the art that various changes may be made and equivalents may be substituted for elements thereof without departing from the true spirit and scope of the invention. In addition, many modifications may be made without departing from the essential teachings of the invention.

What is claimed is:

1. A light emitting laser integrated on a single semiconductor chip and operating as a bipolar transistor device, wherein the improvement is characterized by:
    a light sensitive region, said laser including means for detecting an external input light signal of a first modulated intensity applied to said light sensitive region of said laser, said light signal causing a change in the electric current flow to at least one portion of said laser resulting in an output light signal of an amplified modulated intensity corresponding to said modulated intensity of the input light signal.

2. A plural layer semiconductor diode laser wherein the improvement is characterized by:
    a first substrate region (13) of light emitting semiconductor crystal of a first conductivity-type,
    a second region (11) of light emitting semiconductor crystal of a second conductivity-type formed in said first substrate region (13),
    a third region (12) of light emitting semiconductor crystal of said second conductivity-type formed in said first substrate region (13) and in close proximity to said second region (11), said first, second and third regions defining a homostructure optical laser modulator wherein a laser light is emitted from said second region, said laser light being modulated in accordance with small changes in external light applied to the area of said first region (13) between said second (11) and third (12) regions.

3. The diode laser as set forth in claim 2, further including
    a fourth region (24) of light emitting semiconductor crystal of said second conductivity-type formed on said first substrate region (13) and in close proximity to said third region (12), said fourth region conforming said homostructure optical laser modulator into symmetric operation, wherein laser light is emitted from said second region under modulated control in accordance with small changes in external light selectively applied to the areas of said first region (13) between said second (11) and third (12) regions and between said third (12) and fourth (24) regions.

4. The diode laser as set forth in claim 2, further including
    additional layers of other light emitting semiconductor crystals of said first conductivity-type over said first (13) and second (11) regions, thereby conforming said homostructure optical laser modulator with a single-heterostructure optical laser modulator, wherein the additional layers serve to confine the laser light output, lower threshold current, and increasing laser efficiency.

5. The diode laser as set forth in claim 3 further including
additional layers of other light emitting semiconductor crystal of said first conductivity-type over said first (13), second (11), and third regions, thereby conforming said homostructure symmetrical optical laser modulator into a single-heterostructure symmetrical optical laser modulator, wherein the additional layers serve to confine the laser light output, lower threshold current, and increase laser efficiency.

6. The diode laser as set forth in claim 4, further including
an optical grating (67) between said second (11) and third (12) regions, and said additional layers to provide optical feedback of said laser light output so as to aid in directing the output of the laser light generated.

7. A plural layer semiconductor diode laser wherein the improvement is characterized by:
a first substrate layer (41) of light emitting semiconductor crystal of a first conductivity-type,
a second layer (42) of doped light emitting semiconductor crystal of a first conductivity-type,
a third layer (43) of light emitting semiconductor crystal of a first conductivity-type,
a fourth layer of doped light emitting semiconductor crystal of a first conductivity-type,
first and second regions of masking material formed on said fourth layer (44) to receive external applied light,
third, fourth, and fifth regions of a second conductivity-type formed in said second (42), third (43), and fourth (44) layers defined by the edges of and between said first and second regions of masking material on said fourth layer (44), said layers and regions defining a double-heterostructure optical laser with dually optically excited regions to modulate the laser light emitted from said laser.

8. A plural layer semiconductor diode laser and an electronic circuit integrated into a single plural layer semiconductor device wherein the improvement is characterized by:
an electronic circuit portion comprising:
a first substrate layer (71) of semiconductor crystal of a first conductivity-type, said first substrate layer having first and second oppositely disposed regions (72, 73) of a second conductivity-type,
a second layer (74) of semiconductor crystal of a second conductivity-type overlying said first layer (71) and said first (72) and second (73) regions, and
a third layer (75) of semiconductor crystal of said first conductivity-type overlying a part of said second layer (74),
a fourth layer (76) of semiconductor crystal of said first conductivity-type overlying a said third layer, said fourth layer providing low resistance contact between said electronic circuit portion and said laser portion,
a diode laser portion comprising:
a fifth layer (77) of light emitting semiconductor crystal of said first conductivity-type overlying said fourth layer (76),
a sixth layer (78) of optically active light emitting semiconductor crystal of said first or second conductivity-types overlying said fifth layer,
a seventh layer (79) of light emitting semiconductor crystal of said second conductivity-type overlying said sixth layer to confine the laser light generated by and in said sixth layer (78),
an eighth layer (791) of light emitting semiconductor crystal of said second conductivity-type overlying said seventh layer,
whereby when a first external bias supply is applied to said eighth layer, said electronic circuit portion conducts current providing current to enable the laser portion to generate a laser light output from said sixth layer.

9. The semiconductor device as set forth in claim 7 wherein small changes in amplitude of an external light source applied to said first substrate layer (71) causes relatively large changes in laser light output from said sixth layer (78).

10. The semiconductor device as set forth in claim 9 wherein small changes in amplitude of an external current source applied to the section of said second layer (74) not overlayed by said third layer (75) causes relatively large changes in laser light output from said sixth layer (78).

11. The semiconductor device as set forth in claim 8 wherein said first through eighth layers are all planar to the other so that small changes in amplitude of an external light source applied to said first substrate layer (71) causes relatively large changes in laser light output from said optically active light emitting semiconductor crystal layer (88).

12. The semiconductor device as set forth in claim 8 wherein said first through eighth layers are all planar to the other so that small changes in amplitude of an external current source applied to said eighth layer causes relatively large changes in laser light output from said optically active light emitting semiconductor crystal layer (88).

13. A plural layer semiconductor diode laser and a field effect transistor integrated with a single plural layer device wherein the improvement is characterized by:
a first substrate layer (101) of semiconductor crystal,
a second layer (102) of doped semiconductor crystal of a first conductivity-type overlying said first layer,
a third layer (103) of semiconductor crystal of said first conductivity-type overlying said second layer,
said field effect transistor portion comprising:
a fourth layer (104) of doped semiconductor crystal of said first conductivity-type overlying said third layer (103) in two sections in close proximity to each other leaving an exposed section of said third layer, defining the gate region of said field effect transistor portion,
a fifth layer (105) of semiconductor crystal of said first conductivity-type overlying both sections of said fourth layer (104),
a sixth layer (106) of ohmic contact material with which to connect to external bias supplies, and wherein one edge of said first through fifth layers has been formed into the region of second conductivity-type crystal, said region defining the drain region of said field effect region, with the drain region of the third layer being the optically active area generating the laser light output, said laser portion comprising two contiguous sections of said fourth through sixth layers, such that small changes in amplitude of an external light source applied to said gate region of said field effect transistor portion causes relatively large changes in laser light from the optically active region of said third area.

14. A plural layer semiconductor diode laser and an avalanche photodetector in series therewith integrated into a single plural layer device wherein the improvement is characterized by:
   a first substrate layer (115) of semiconductor crystal,
   a second layer (116) of doped semiconductor crystal overlying said first layer,
   a third layer (117) of optically active light emitting semiconductor crystal overlying said second layer,
   a fourth layer (118) of doped semiconductor crystal overlying said third layer (117) in two sections in close proximity to the other leaving an exposed section of said third layer,
   a fifth layer (119) of doped semiconductor crystal overlying both sections of said fourth layer (119),
   said first through fifth layers being of semiconductor crystal of a first conductivity-type, with said second through fifth layers and part of said first layer having the outer edges thereof formed into regions of semiconductor crystal of a second conductivity-type, said outer edge regions being transverse to the exposed section of said third layer (117),
   a sixth layer (120) overlying both regions of said fifth layer (119), said sixth layer (120) comprising regions of ohmic contact material overlying the semiconductor crystal of said fifth layer (119) of said second conductivity-type, and also comprising a center section of oxide material overlying the semiconductor crystal of said fifth layer (119) of said first conductivity-type, wherein small changes in amplitude of an external light source applied to said oxide material causes relatively large changes in laser light output from said optically active light emitting semiconductor crystal of said third layer (117).

15. The semiconductor device as set forth in claim 14 wherein each of the four ohmic contact material sections are connected to external voltage biases, such that one of the regions of the first through fifth layers of semiconductor material comprises the avalanche photodetector section, while the remaining regions of said first through fifth layers comprise the laser diode section.

16. A plural layer semiconductor diode laser and a silicon avalanche photodetector integrated into a single plural layer device wherein the improvement is characterized by:
   a first substrate layer (127) of n-type silicon crystal,
   a second layer (129) of metallic material overlying said first layer (127), said second layer having an aperture (131) therein to allow external light to impinge on said first layer (127), said first layer having a region of p-type silicon crystal in the area immediately proximate to said aperture,
   a third layer (134) of p-type semiconductor crystal overlying only a portion of said second layer (129),
   a fourth layer (135) of p-type semiconductor crystal overlying said third layer (134),
   a fifth layer (136) of p-type semiconductor crystal overlying said fourth layer (135),
   a sixth layer (137) of n-type semiconductor crystal overlying said fifth layer (136), and
   a seventh layer (138) of n-type semiconductor crystal overlying said sixth layer (137), such that small changes in amplitude of said external light applied to said aperture (131) causes relatively large changes in laser light output from the optically active light emitting semiconductor crystal layer of said laser portion.

17. A light emitting laser integrated on a single semiconductor chip and operating as a bipolar transistor device, wherein the improvement is characterized by:
   a light sensitive region, said laser detecting an external input light signal of a first modulated intensity applied to said light sensitive region of said laser, said light signal causing a change in the electric current flow to at least one portion of said laser resulting in an output light signal of an amplified modulated intensity corresponding to the modulated intensity of the input light signal, said light sensitive region comprising an avalanche photodetector integrated on said single semiconductor chip, said photodetector sensing said input light signal and acting to modulate the current to the light emitting region of said laser resulting in said amplified and modulated light output.

18. The laser as set forth in claim 17 wherein said avalanche photodetector is integrated in said chip such that said laser and said photodetector are electrically connected to an external bias supply so that when said external input light signal impinges on the light sensitive region of said photodetector, the current flow to at least a portion of said laser is modulated to thereby amplify and modulate said light output.

19. The laser as set forth in claim 18 further including a separate external bias supply connected to said laser for pre-biasing of said laser.

20. A light emitting laser integrated on a single semiconductor chip and operating as a bipolar transistor device wherein the improvement is characterized by:
   a light sensitive region, said laser detecting an external input light signal of a first modulated intensity applied to light sensitive region of said laser, said light signal causing a change in the electric current flow to at least one portion of said laser resulting in an output light signal of an amplified modulated intensity corresponding to the modulated intensity of the input light signal, said light sensitive region comprising a field effect transistor integrated on said single semiconductor chip, the conduction of current from the source to the drain of said field effect transistor being controlled by said input light signal as applied to the gate region of said field effect transistor, said source to drain current controlling the current flow through at least one portion of said laser resulting in said amplified and modulated light output.

21. A light emitting laser integrated on a single semiconductor chip and operating as a bipolar transistor device wherein the improvement is characterized by:
   a light sensitive region, said laser detecting an external input light signal of a first modulated intensity applied to light sensitive region of said laser, said light signal causing a change in the electric current flow to at least one portion of said laser resulting in an output light signal of an amplified modulated intensity corresponding to the modulated intensity of the input light signal, said light sensitive region comprising an optically controlled field effect transistor integrated on said single semiconductor chip, said field effect transistor being electrically interconnected to said laser such that said external input light signal causes an amplified optical output signal to be generated by said laser.

* * * * *

UNITED STATES PATENT AND TRADEMARK OFFICE
CERTIFICATE OF CORRECTION

PATENT NO. : 4,349,906

DATED : September 14, 1982

INVENTOR(S) : Donald R. Scifres et al

It is certified that error appears in the above-identified patent and that said Letters Patent are hereby corrected as shown below:

Title page, Column 2, correct the spelling of the Attorney to
--Franklyn C. Weiss--.

Claim 9, line 1, delete "7" and insert --8--.

Signed and Sealed this

Twenty-third Day of November 1982

[SEAL]

Attest:

Attesting Officer

GERALD J. MOSSINGHOFF

Commissioner of Patents and Trademarks